United States Patent [19]
Kikuchi et al.

[11] Patent Number: 5,089,710
[45] Date of Patent: Feb. 18, 1992

[54] ION IMPLANTATION EQUIPMENT

[75] Inventors: Shuji Kikuchi, Kumamoto; Mitsuyuki Yamaguchi, Yokohama; Masahiko Matsudo, Kofu, all of Japan

[73] Assignee: Tokyo Electron Limited, Tokyo, Japan

[21] Appl. No.: 577,001

[22] Filed: Sep. 4, 1990

[30] Foreign Application Priority Data

Sep. 4, 1989 [JP] Japan ............................. 1-228942

[51] Int. Cl.⁵ .......................................... H01J 37/317
[52] U.S. Cl. ............................ 250/492.3; 250/442.11
[58] Field of Search ............. 250/492.21, 251, 492.3, 250/442.1

[56]  References Cited
U.S. PATENT DOCUMENTS

| 4,135,097 | 1/1979 | Formeris et al. | 250/398 |
| 4,249,077 | 2/1981 | Crawford | 250/306 |
| 4,361,762 | 11/1982 | Douglas | 250/251 |
| 4,419,203 | 12/1983 | Harper et al. | 250/492.3 |
| 4,675,530 | 6/1987 | Rose | 250/492.21 |
| 4,886,971 | 12/1989 | Matsumura et al. | 250/452.3 |
| 4,933,546 | 6/1990 | Muntz et al. | 250/251 |
| 4,939,360 | 7/1990 | Sakai | 250/251 |

FOREIGN PATENT DOCUMENTS

| 0093831 | 11/1983 | European Pat. Off. |
| 0291279 | 11/1988 | European Pat. Off. |
| 0324247 | 7/1989 | European Pat. Off. |
| 57-119442 | 7/1982 | Japan |
| 58-166930 | 10/1983 | Japan |
| 63-224138 | 9/1988 | Japan |
| 64-86435 | 3/1989 | Japan |

Primary Examiner—Bruce C. Anderson
Attorney, Agent, or Firm—Oblon, Spivak, McClelland, Maier & Neustadt

[57] ABSTRACT

An ion implantation equipment for implanting ion beam into an implanting target characterized in that an electrons are induced to the direction of an ion beam being injected to said implanting target, and a predetermined bias voltage is applied between a plasma generation chamber and Faraday.

11 Claims, 5 Drawing Sheets

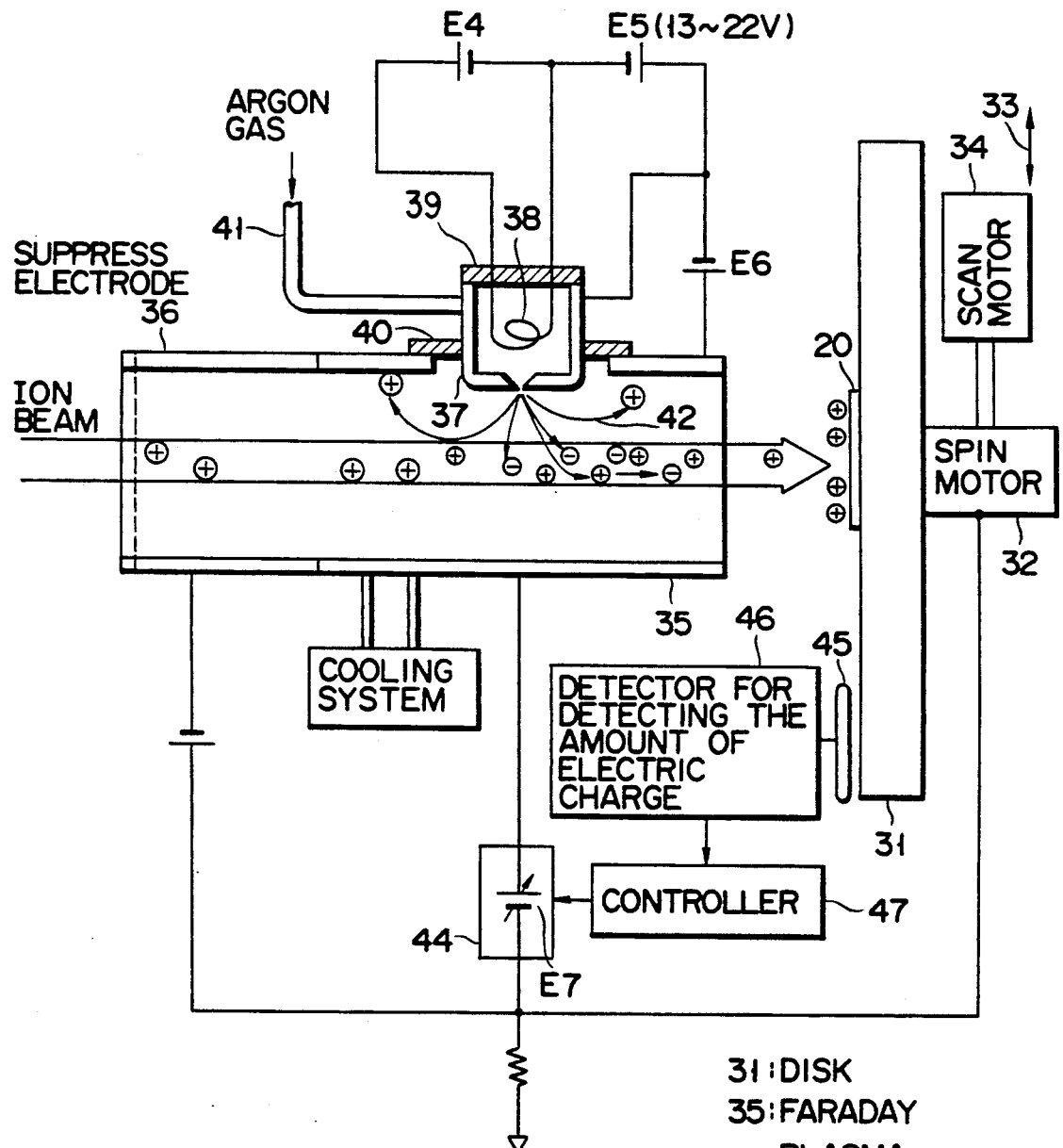
F I G. 1

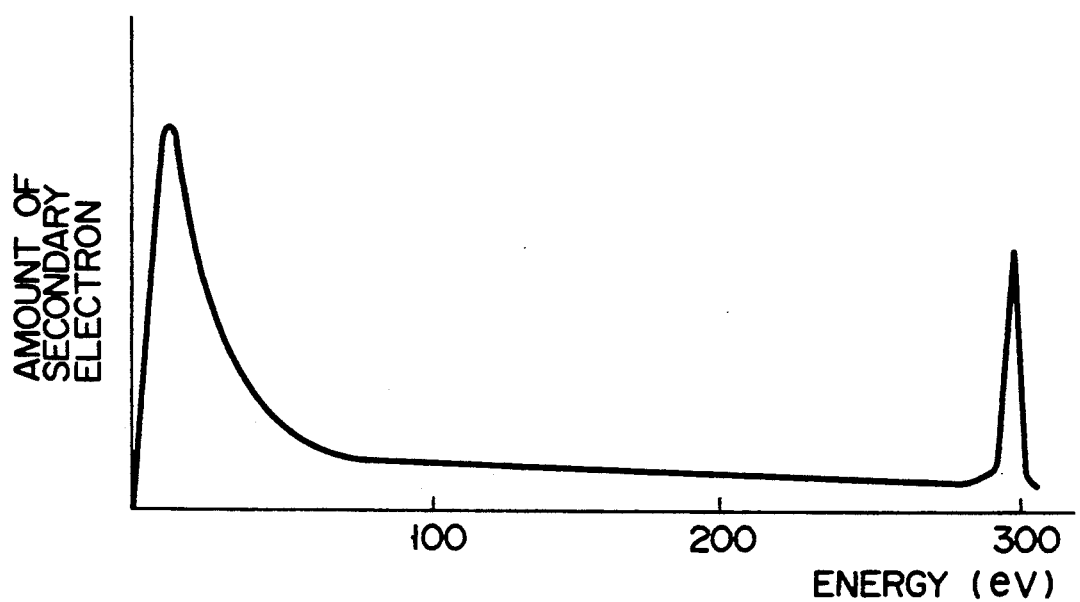
ENERGY DISTRIBUTION OF
SECONDARY ELECTRON
F I G. 5

ION IMPLANTATION EQUIPMENT

BACKGROUND OF THE INVENTION

1. Field of the Invention

The present invention relates to an ion implantation equipment.

2. Description of the Related Art

In the ion implantation equipment, as a method for implanting an ion, there is used a method in which impurity material is ionized and the ion is implanted into a semiconductor substrate, for example, a semiconductor wafer with high energy. In this case, in the ion implantation equipment, there are a medium current type, in which beam current of ion is 2 mA or less, and a high current type, in which beam current of ion is 2 mA or more. For example, the high current type is constructed as shown in FIG. 4.

Specifically, FIG. 4 shows the outline of the entire ion implantation equipment. A part of necessary energy is supplied to an ion 1, which is drawn from an ion source 2, from an accelerating tube 3. Thereafter, the ion is introduced into a mass spectrograph 4 and a required ion is selected. The selected ion 1 is accelerated by an accelerating tube 5 and implanted into the semiconductor wafer mounted on a disc 10, which is a rotational mount base.

In a case where ion-implantation is performed in a semiconductor wafer 20 as mentioned above, oxide layer, which is exposed on the surface of the wafer 20, is charged up to be generated a positive charge of ion 1. If an amount of surface charge, which is generated by the above-mentioned charging, is more than an amount of the insulation breakage charge, the insulating film 20 is broken. The insulation breakage and failure occur remarkably as degree of integration becomes higher. This is a big subject matter to be overcome in IC which is developed from IC of 1M to 4M, 16M and to 64M.

Due to this, in conventional, there is generally used a method, in which the irradiation of electron, which is called an electron flood, is performed in the wafer 20 simultaneously with the implantation of ion 1 in Faraday 6, and the positive charge is neutralized, thereby preventing from being charged up (U.S. Pat. No. 4249077, Published Unexamined Japanese Patent Application Nos. 58-166930 and 64-86435).

In other words, a thermoelectron (primary electron $e_1$), which is generated by a filament, is drawn from the filament at the speed in accordance with an accelerating voltage (for example, 300 V), which is a potential difference between the filament, which is the first electrode discharging electrode, and a wall surface of an opposite metal electrode, and collides with the wall surface of the opposite metal electrode. Thereby, a secondary electron $e_2$ is emitted from the wall surface of the opposite metal electrode. The discharged secondary electron $e_2$ is incident on the semiconductor wafer so as to neutralize the surface charge, which is generated in the insulating film region.

In this case, an amount of the generation of the secondary electron responds to the potential difference between the primary electron discharge electrode and the opposite metal electrode for the secondary electro discharge, and is fixed in accordance with an amount of the ion beam current.

In the electron shower, the following demerit is found:

As shown in FIG. 5, since the energy distribution of the secondary electron includes high energy components such as Auger electron and a diffraction electron, the electron with high energy collides with the insulating film of the wafer and a negative chargeup is generated.

Also, when the ion implantation is performed, the insulating film of the semiconductor wafer is sputtered by ion beam and becomes splash. The splash is adhered to the inner wall surface of Faraday, which is the ion implantation chamber, thereby forming an insulating film on the inner wall surface. Due to this insulating film, a negative charge is charged up on the inner wall surface, and the potential of the opposite metal electrode of the filament changes to the negative side.

As mentioned above, when the potential of the opposite metal electrode changes, the energy of the electron reaching to the wafer is increased than the initial energy. Then, the electron with high energy collides with the insulating film region of the surface of the semiconductor wafer, on which ion beam is not irradiated, thereby generating the negative charge up.

In other words, in the electron flood, the accelerating voltage, for example, high voltage of 300 V is applied to the primary electron. However, since the accelerated primary electron was often directly incident on the surface of the semiconductor wafer, the surface of the semiconductor wafer was often damaged.

SUMMARY OF THE INVENTION

An object of the present invention is to provide an ion implantation equipment which can prevent the chargeup, which is generated by the ion implantation.

More specifically, in the ion implantation equipment for implanting ion beam into an implanting material, it is featured that an electron is made incident on ion beam to be implanted.

Also, according to the present invention, it is featured that plasma is generated and an electron generated by plasma is made incident on the ion beam.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a schematic view of the main parts showing one embodiment of the ion implantation equipment of the present invention

FIG. 5 is a view showing an energy distribution of a secondary electron.

DETAILED DESCRIPTION OF THE PREFERRED EMBODIMENTS

Figure 2:
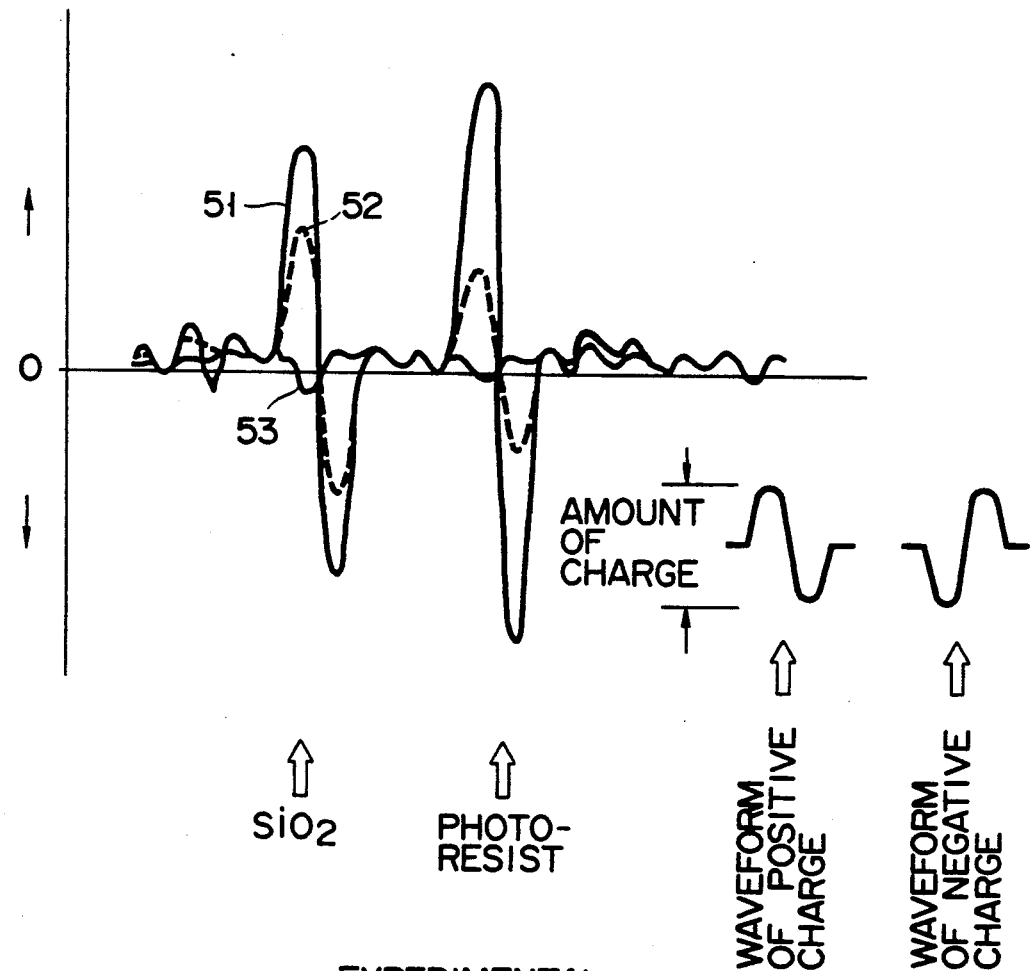
FIG. 2 is a view showing an experimental result confirming the effect of voltage E6.

An embodiment of the ion implantation of the present invention, which is applied to a large current ion implantation equipment, with reference to the drawings.

In FIG. 1, a plurality of semiconductor wafters 20, for example 13 semiconductor wafers, are mounted on a disc 31, which is a rotational mount base. The disc 31 is designed to be rotated by a spin motor 32 at a speed of, for example, 1000 rpm.

Also, the disc 31 is linearly reciprocated in a radial direction by a scan motor 34 as shown by an arrow 33. Moreover, in the disc 31, a mechanical scanning structure is provided so that ion beam scans on the surface of the semiconductor wafter.

Then, Faraday 35 is provided in the side where ion beam to the semiconductor wafer 20 is introduced. The Faraday 35 is formed of a rectangular paralelepiped metal. The Faraday 35 is provided in order to prevent secondary electron, which are generated when an ion is implanted in the surface of the semiconductor wafer 20, from flowing outside. In other words, this is because if the secondary electrons flow outside, when an amount of ions to be implanted measured, it impossible to correctly measure the amount of ions to be implanted.

In the front stage of the portion of the Farada tube 35 where ion beam is introduced, a suppress electrode 36 is provided. Then, a suppression bias voltage, for example, -1000 V is applied to the suppress electrode 36.

Also, regarding ion beam which is incident on the semiconductor wafer, there is provided a mechanism in which the electron is made incident on a predetermined beam to be neutralized. For example, there is provided a plasma generation chamber 37 in a part of the wall surface of the Faraday tube 35. The plasma generation chamber 37 is placed at the position where the filament in chamber 37 cannot face the semiconductor wafer 20. This is because contamination, which is generated in a plasma chamber, is suppressed for the wafer.

Then, Ar (argon) gas is introduced into the chamber 37 in order to generate plasma. Further, there is provided an electron discharge source, for example, a filament 38, which is formed of tungsten, in the chamber 37. Moreover, voltage E4 for discharging a thermoelectron from the filament 38 is applied between both ends of the filament 38. Also, plasma generation chamber 37 is used as an anode and the filament as a cathode and voltage E5 for generating plasma is applied thereto. Thereby, the electrons from the filament 38 acts on gas, and plasma is generated. In this case, since voltage E5 may generate plasma, low voltage of about 13 to 22 V may be satisfied.

In energy of 100 eV or less, since the sputter rate is proportional to the square of the energy of sputter ion, the spatter rate can be largely reduced by dropping the accelerating voltage E5. Thereby, since the sputtering of the filament can be controlled, the contamination of the wafer due to composed material can be prevented.

Moreover, in this case, the potential of the plasma generation chamber 37 is lowered by voltage E6 against Faraday 35. It is noted that the plasma generation chamber 37 and Faraday 35 may be short-circuited to have the same potential as each other.

Additionally, reference numeral 39 is an insulator, which is used as a cover for the chamber 37. Reference numeral 40 is an insulating member, which is used as an insulator for supporting Faraday 35 against the chamber 37.

Also, inactive gas, such as Ar gas is supplied to the plasma generation chamber 37 via a gas supply tube 41.

In the bottom surface facing Faraday 35 of the plasma generation chamber 37, there is provided a through hole 42 for sending plasma, which is generated in the chamber 37, into Faraday 35. The narrow path for sending plasma using the through hole 42 is sufficiently narrow, and its diameter is, for example, is about 3 mm. In this way, the narrow path for sending plasma is narrowed, thereby plasma can be generated without decreasing the degree of vacuum in Faraday 5 and the difference in the inflow, which is caused by vacuum down, can be controlled.

Reference numeral 43 is a cooling system. By the use of the cooling system, for example, pure water is sent into the wall of Faraday 35 and Faraday 35 is cooled. It is, of course, possible to attach a cooling mechanism to the chamber 37 as required.

Also, a bias voltage E7 is applied to Faraday 35 from a variable bias voltage supply source 44. This is because the electron is drawn from the narrow path for sending plasma in the plasma generation chamber 37 into the ion beam path in Faraday.

Also, at the position of the angle of rotation of the ion implantation surface of the disc 31, which is different from that of Faraday 35, there is provided a conductive plate 45 (what is called charge monitor), which is opposite to the entire surface of the ion implantation surface of the semiconductor wafer 20, in order to monitor the amount of electric charge accumulated in the insulating film region of the surface of the semiconductor wafer. The output of a detector 46 for detecting the amount of electric charge is supplied to a controller roller 47. By the use of the control 47, the value of bias voltage E7 is controlled. It is, of course, possible to control the outflow of the electron sent from the chamber 37.

The operation of the above-structured equipment will be explained as follows:

The ion beam is made incident on the surface of the semiconductor wafer 20, which is mounted on the disc 31 via the suppress electrode 36 and Faraday 35 and mechanically scanned, and implanted in the wafer 20 as an ion.

At this time, in the plasma generation chamber 37, the filament 38 is heated by voltage E4 and the thermoelectron is generated. Then, the thermoelectron excites Ar gas, which is previously introduced by the potential difference between the filament 38 and the chamber 37 to be made plasma.

The electron, which is generated in Ar plasma, passes through the through hole 42 of the plasma generation chamber 37 and is sent to the ion beam path in Faraday 35. If only the electron is selectively introduced in the ion beam by the positive electric field of the ion beam and the wafer is charged, there is a potential gradient in the axial direction of the ion beam, so that the electron in the ion beam is absorbed into the beam by the potential gradient and the positive charge of the wafer is neutralized.

Therefore, it is possible to prevent the electric charge, which generates insulation breakage in the insulation film region of the wafer surface, from being charged.

In this case, the amount of electrons, which reaches to the wall of Faraday 35 and the surface of the wafer 20 from the plasma source, can be controlled by changing bias voltage E7 to be applied to Faraday 35. In other words, since the degree of the mobility of the electron is higher, the negative charge tends to be generated on the surface of the wafer. However, in this embodiment, the amount of the charge, which is generated on the surface of the wafer 20, is detected via the conductive plate 45 by the detector 45, the detected output is supplied to the controller 47, and the value of voltage E7 of the bias voltage supply source is controlled by the controller 47. Thereby, the amount of the charge of the semiconductor wafer 20 can be maintained to be less than the insulation breakage potential in accordance with the bias voltage.

The potential of the plasma generation chamber 37 can be floatingly set. However, as mentioned above, in this embodiment, the potential of the plasma generation chamber 37 is set to be the same as that of Faraday 35 or lower by voltage E6. Therefore, plasma is easily sent from the plasma generation chamber 37 to Faraday 35. Thereby, the effect of neutralizing ion beam can be improved. Then, in a case where a variable voltage source, which is voltage E6 ($\geq$), is provided between the plasma generation chamber 37 and Faraday 35, plasma can be controlled to be easily sent from the plasma generation chamber 37 by suitably controlling voltage E6

FIG. 2 is a view showing an experimental result confirming the effect of voltage E6. This shows the result of the case in which As (arsenic) is used as dopant, its energy is 70 keV, and ion beam current is mA.

In the drawing, a thin solid line 51 shows the case in which an ion implantation is performed without generating plasma. According to this case, the accumulation of the charge is found out in a photoresist and the insulating film. A broken line 52 shows the case in which the potential of the plasma generation chamber 37 is floatingly set and plasma is generated under arc voltage of 22 V and arc current of 6A. In this case, the surface potential of the wafer is slightly lowered at the insulating film A thick solid line 53 shows the case in which voltage E6 is inserted between the plasma generation chamber 37 and Faraday 35. In this experiment, E6=0 V, that is, the portion between the plasma generation chamber 37 and Faraday 35 is short-circuited.

As is clear from FIG. 2, it can be confirmed that the neutralization effect, which is obtained by inserting voltage E6 between the plasma generation chamber 37 and Faraday 35, is considerable.

According to the present invention, since the electron in plasma is used, a large amount of electrons can be supplied to the ion beam and neutralized. Also, plasma can be generated by the use of the electron with low energy (max. 22V). Also, since the conventional electron with high energy such as electron shower is not used, the damage to the semiconductor wafer, which is caused by the electron, can be reduced.

Moreover, by the use of plasma, the electron with low energy reaches to the beam without diverging and the electron can be effectively neutralized in the ion beam. Furthermore, by the use of plasma, the electron works to maintain the electric neutral itself, and is always sent to the ion beam, and the function of neutralization can be surely performed.

Figure 3:
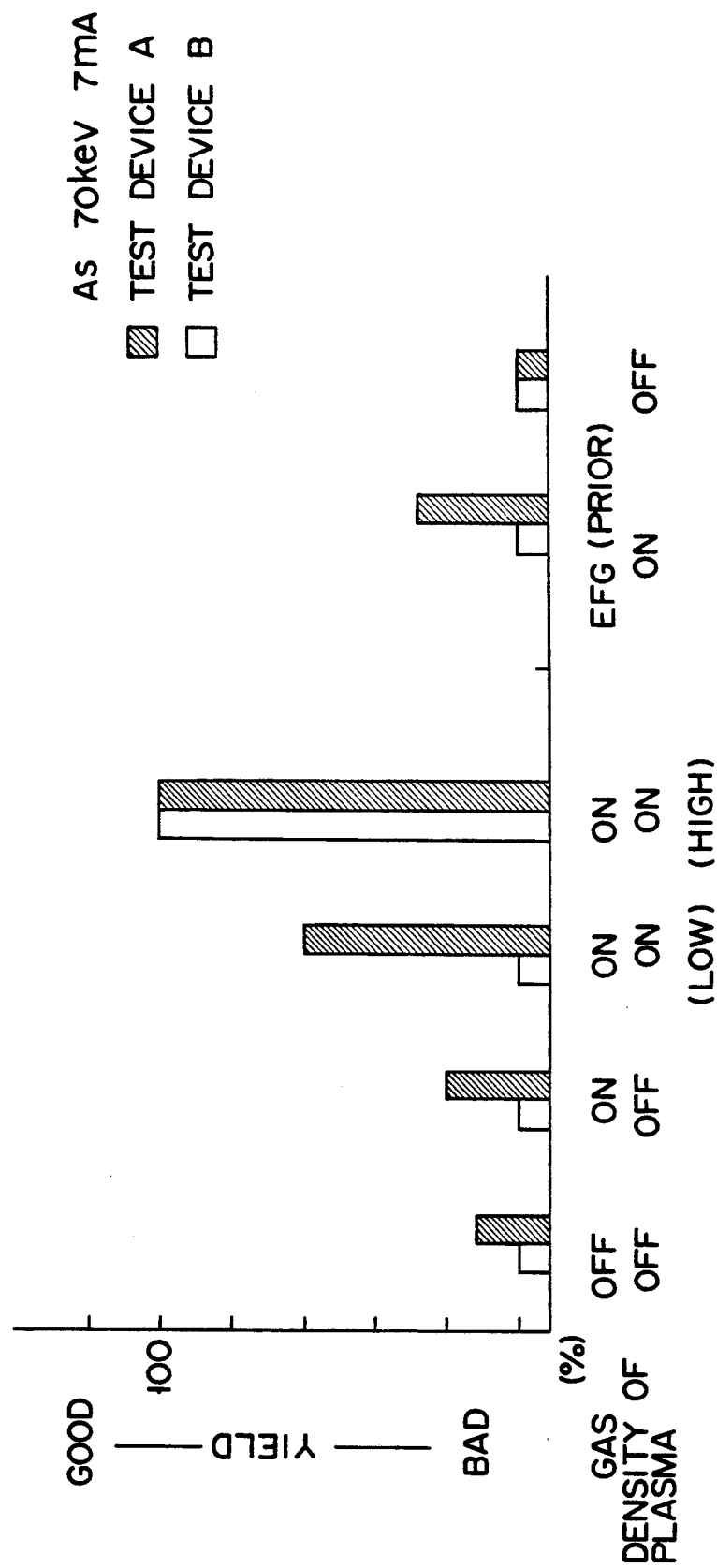
FIG. 3 is a view showing an experimental result comparing the effect of neutralization due to plasma with a conventional electron shower.
Figure 4:
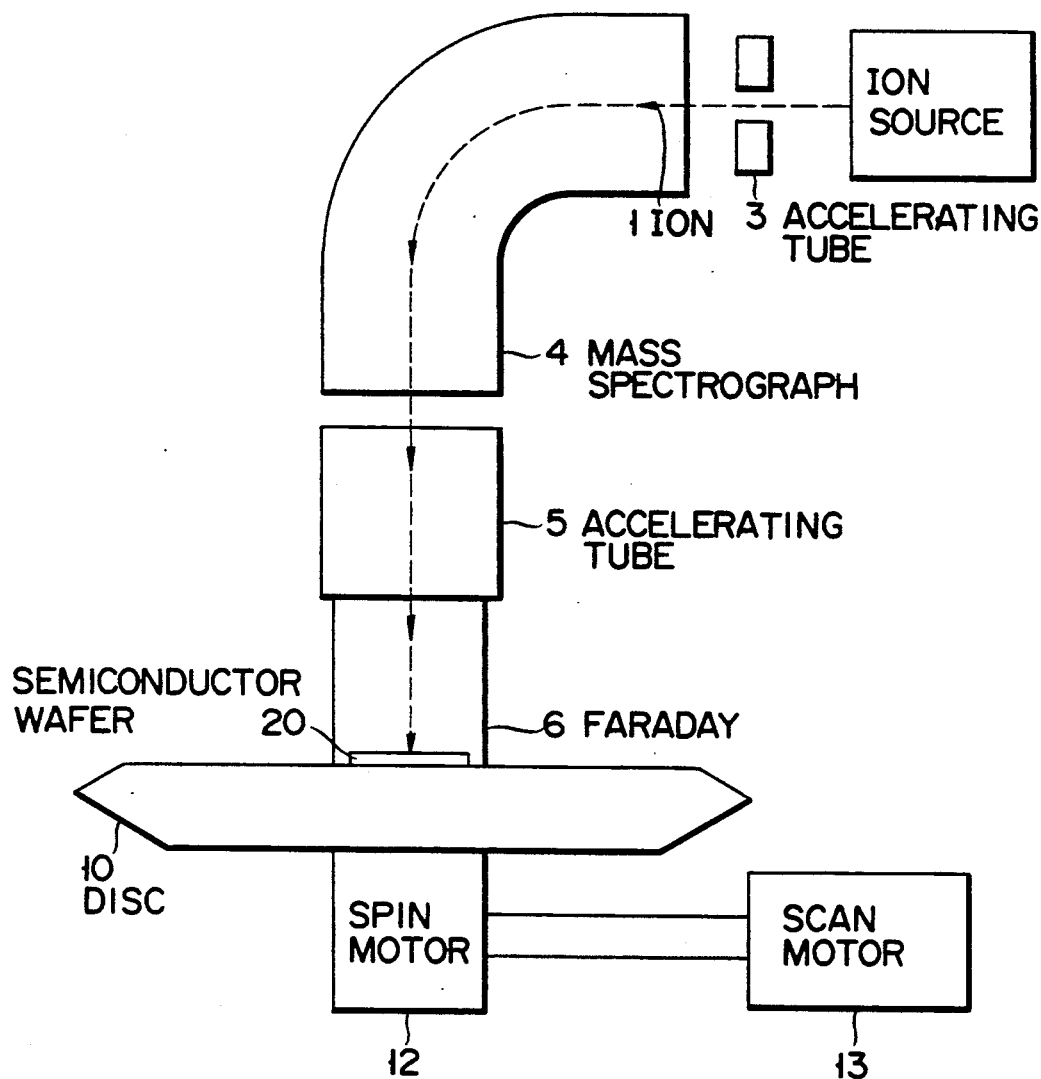
FIG. 4 is a view explaining the outline of the conventional ion implantation.

FIG. 3 shows an experimental result comparing the effect of neutralization due to plasma with the conventional electron shower. In the drawing, under the condition of As+beam, energy of 70 keV, current is 7 mA. Particularly, test equipment B show the case in which the equipment having high sensitivity is used.

As is obvious from FIG. 3, according to the present invention, it was confirmed that defective products, which were caused by insulation breakage, were not produced by the ion implantation and the effect of the prevention of the charge-up was improved.

It is needless to say that the implanting material is not limited to the semiconductor wafer and can be applied to various materials.

Also, the present invention can be applied to the ion implantation equipment of medium current type.

As mentioned above, according to the present invention, the electron is made incident on the ion beam injecting into the implanting target, thereby the insulating film region of the surface of the implanting target can be prevented from being charged up. Since the electron with low energy is used, the electrostatic breakage, which is generated on the surface of the implanting target by the electron with high energy, can be reduced.

Also, according to the present invention, the neutralization effect of the ion can be considerably improved by applying a predetermined bias voltage between the plasma generation chamber and Faraday.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An ion implantation equipment for implanting ion beam into an implanting target, wherein:
   plasma is generated and an electron generated by said plasma is induced to said ion beam;
   said ion implantation equipment comprises;
   a Faraday enclosing said ion beam before said implanting target;
   a plasma generation chamber provided in a part of a wall surface of said Faraday and projecting inward and outward from the wall surface;
   an electron discharging source in said plasma generating chamber;
   a through hole in said part of a wall surface of said Faraday for sending generated plasma into said Faraday from said chamber; and
   a variable bias voltage supply source for applying a bias voltage to said Faraday.

2. An ion implantation equipment according to claim 1, wherein a filament provided in said chamber is provided at the position where said chamber cannot face said implanting target.

3. An ion implantation equipment according to claim 1, wherein a conductive plate for monitoring the amount of electric charges accumulated in the insulating film region of the surface of said implanting material is provided in opposite to a disc on which said implanting equipment is mounted.

4. An ion implantation equipment according to claim 1, wherein the diameter of said through hole is about 2 mm.

5. An ion implantation equipment according to claim 1, wherein a cooling system is attached to said chamber.

6. An ion implantation equipment for implanting ion beam into an implanting target, which comprises:

a Faraday enclosing said ion beam before said implanting target;

a plasma generation chamber provided in a part of a wall surface of said Faraday to be projected inward and outward from the wall surface;

an electron discharging source in said chamber;

a through hole in said part of a wall surface of said Faraday for sending generated plasma into said Faraday;

a variable bias voltage supply source for applying a bias voltage to said Faraday; and wherein electrons are injected to said ion beam being injected to said implanting target.

7. An ion implantation apparatus for implanting ion beam into a target, comprising:

(a) a Faraday enclosing the ion beam in front of the target;

(b) a plasma generating chamber provided in a part of a wall surface of said Faraday to be projected inward and outward from the wall surface, wherein said plasma generating chamber conceals the target from view and communicates with said Faraday through a small through hole;

(c) a filament provided in said plasma generating chamber for emitting electrons;

(d) a bias voltage supply source for applying a bias voltage to said Faraday;

(e) detecting means for detecting an amount of electric charge accumulated in the insulating film region of the surface of said target; and (f) a cooling system provided to said plasma generating chamber;

whereby electrons are introduced from said plasma generating chamber into said Faraday through said small through hole.

8. An ion implantation apparatus according to claim 7, further comprising:

a controller for controlling said bias voltage supply source based on the amount of electric charge detected by said detecting means.

9. An ion implantation apparatus according to claim 7, wherein the diameter of said small through hole falls within a range of between 1 and 3 mm.

10. An ion implantation apparatus according to claim 7, wherein a DC voltage of 13 to 22 V is applied between said plasma generating chamber and said filament.

11. An ion implantation apparatus according to claim 7, which further comprises:

means for rotating said target relative to an ion beam.

* * * * *